United States Patent
Chevallier (10) Patent No.: US 6,813,183 B2
(45) Date of Patent: Nov. 2, 2004

(54) EXTERNALLY TRIGGERED LEAKAGE DETECTION AND REPAIR IN A FLASH MEMORY DEVICE

(75) Inventor: Christophe J. Chevallier, Palo Alto, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/198,404

(22) Filed: Jul. 18, 2002

(65) Prior Publication Data

US 2002/0191440 A1 Dec. 19, 2002

Related U.S. Application Data

(63) Continuation of application No. 09/379,155, filed on Aug. 23, 1999, now abandoned.

(51) Int. Cl.$^7$ .............................................. G11C 16/06
(52) U.S. Cl. ............................ 365/185.09; 365/185.19; 365/185.24
(58) Field of Search ....................... 365/185.09, 185.19, 365/185.24, 185.29, 185.3, 185.83

(56) References Cited

U.S. PATENT DOCUMENTS

| | | | |
|---|---|---|---|
| 4,719,598 A | 1/1988 | Stockton | 365/189 |
| 5,526,364 A | 6/1996 | Roohparvar | 371/22.1 |
| 5,675,540 A | 10/1997 | Roohparvar | 365/185.22 |
| 5,723,990 A | 3/1998 | Roohparvar | 327/81 |
| 5,751,944 A | 5/1998 | Roohparvar et al. | 395/183.18 |
| 5,790,459 A | 8/1998 | Roohparvar | 365/185.21 |
| 5,793,775 A | 8/1998 | Roohparvar | 371/22.1 |
| 5,825,700 A | 10/1998 | Roohparvar | 362/201 |
| 5,896,318 A | 4/1999 | Asada et al. | 365/185.24 |
| 5,930,188 A | 7/1999 | Roohparvar | 365/201 |
| 5,933,434 A | 8/1999 | Roohparvar | 371/21.1 |
| 5,950,145 A | 9/1999 | Roohparvar | 702/109 |
| 6,067,598 A | 5/2000 | Roohparvar et al. | 711/103 |
| 6,108,241 A | 8/2000 | Chevallier | 365/185.33 |
| 6,115,291 A | 9/2000 | Lakhani | 365/185.3 |
| 6,496,027 B1 | 12/2002 | Sher et al. | 324/763 |

FOREIGN PATENT DOCUMENTS

| | | | |
|---|---|---|---|
| EP | 0471541 | 8/1991 | G11C/29/00 |
| EP | 0791933 | 8/1997 | G11C/11/56 |
| EP | 0911833 | 4/1999 | G11C/29/00 |
| JP | 10332797 | 12/1998 | G01R/31/3185 |
| JP | 11-154394 | 6/1999 | G11C/16/02 |
| WO | WO-96/24935 | 8/1996 | G11C/16/06 |

OTHER PUBLICATIONS

"2 MEG×8 Smart 3 Even–Sectored Flash Memory", *MT28F016S3VG Data Sheet* www.micron.com/flash/htmls/datasheets.html, (1999), 7–9.

"8Mb Smart 3 Boot Block Flash Memory", *Micron 1999 Data Book*, (1999), 3–37.

Primary Examiner—Van Thu Nguyen
(74) Attorney, Agent, or Firm—Schwegman, Lundberg, Woessner & Kluth, P.A.

(57) ABSTRACT

Externally triggered leakage detection and repair in a flash memory device. According to one embodiment of the present invention a method includes operating a flash memory device to store data in a number of flash cells and initiating an operation to detect or repair leaky flash cells in the flash memory device by coupling one or more selected signals to the flash memory device from a source external to the flash memory device. According to another embodiment of the present invention a system includes a flash memory device having a number of flash cells and a number of pins coupled to exchange interface signals, address signals, and data signals. The system also includes a controller coupled to the pins of the flash memory device to exchange the interface signals, address signals, and data signals with the flash memory device. The controller includes instructions to store data in the flash cells and initiate an operation to detect or repair leaky flash cells in the flash memory device by coupling one or more selected signals to the pins of the flash memory device.

40 Claims, 9 Drawing Sheets

EXTERNALLY TRIGGERED LEAKAGE DETECTION AND REPAIR IN A FLASH MEMORY DEVICE

This application is a Continuation of U.S. patent application Ser. No. 09/379,155, filed Aug. 23, 1999 now abandoned.

FIELD OF THE INVENTION

The present invention relates generally to memory devices, and more particularly, to externally triggered leakage detection and repair in a flash memory device.

BACKGROUND

Electrically erasable and programmable read-only memory devices having arrays of what are known as flash cells, also called flash EEPROMs or flash memory devices, are found in a wide variety of electrical devices. A flash memory device is typically formed in an integrated circuit. A conventional flash cell, also called a floating gate transistor memory cell, is similar to a field effect transistor, having a channel region between a source and a drain in a substrate and a control gate over the channel region. In addition the flash cell has a floating gate between the control gate and the channel region. The floating gate is separated from the channel region by a layer of gate oxide, and an inter-poly dielectric layer separates the control gate from the floating gate. Both the control gate and the floating gate are formed of doped polysilicon. The floating gate is floating or electrically isolated. The flash memory device has a large number of flash cells in an array where the control gate of each flash cell is connected to a word line and the drain is connected to a bit line, the flash cells being arranged in a grid of word lines and bit lines.

A flash cell is programmed by applying approximately 10 volts to the control gate, between 5 and 7 volts to the drain, and grounding the source and the substrate to induce hot electron injection from the channel region to the floating gate through the gate oxide. The voltage at the control gate determines the amount of charge residing on the floating gate after programming. The charge affects current in the channel region by determining the voltage that must be applied to the control gate in order to allow the flash cell to conduct current between the source and the drain. This voltage is termed the threshold voltage of the flash cell, and is the physical form of the data stored in the flash cell. As the charge on the floating gate increases the threshold voltage increases.

One type of flash memory device includes an array of multi-bit or multi-state flash cells. Multi-state flash cells have the same structure as ordinary flash cells and are capable of storing multiple bits of data in a single cell. A multi-bit or multi-state flash cell has multiple distinct threshold voltage levels over a voltage range. Each distinct threshold voltage level corresponds to a set of data bits, with the number of bits representing the amount of data which can be stored in the multi-state flash cell.

Data is stored in conventional flash memory devices by programming flash cells that have been previously erased. A flash cell is erased by applying approximately −10 volts to the control gate, 5 volts to the source, grounding the substrate and allowing the drain to float. In an alternate method of erasure the control gate is grounded and 12 volts is applied to the source. The electrons in the floating gate are induced to pass through the gate oxide to the source by Fowler-Nordheim tunneling such that the charge in the floating gate is reduced and the threshold voltage of the flash cell is reduced. Flash cells in an array in a flash memory device are grouped into blocks, and the cells in each block are erased together.

A flash cell is read by applying approximately 5 volts to the control gate, approximately 1 volt to the drain, and grounding the source and the substrate. The flash cell is rendered conductive and current in the cell is sensed to determine data stored in the flash cell. The current is converted to a voltage that is compared with one or more reference voltages in a sense amplifier to determine the state of the flash cell. The current drawn by a flash cell being read depends on the amount of charge stored in the floating gate.

The capacity of flash memory devices to store data is gradually being increased by reducing the size and increasing the number of flash cells in each integrated circuit. The reduction in the size of the flash cells renders them more vulnerable to leakage. Leakage is an unwanted loss of charge from the floating gate of a flash cell and may occur for one of several reasons. Data retention may deteriorate as charge slowly drifts out of the floating gate over the 10 to 100 year operating life of the flash memory device. Environmental conditions in which the flash memory device operates, such as temperature, may influence the leakage. The leakage may also occur when the flash cell is disturbed in the following manner. When a flash cell is being programmed, erased, or read, its word line, or bit line, or both, may be coupled to a voltage that is elevated in either a positive or negative direction. Adjacent flash cells sharing the same word line or bit line will also receive the elevated voltage which can disturb voltage differentials between the control gates, drains, and sources of the adjacent flash cells. The disturbance may cause charge to leak from the floating gates of some of the adjacent flash cells. Depending on the array structure multiple cycles of programming or an erase of flash cells in a block could induce leakage in cells in different blocks in the array. If sufficient leakage occurs in a programmed flash cell over its lifetime it may gradually move to a state in which a read operation will indicate that it is erased. This is called a bit failure. As flash cells get smaller and more flash cells are placed in a given area of a silicon chip there is an increased tendency for a flash cell to be disturbed and to suffer leakage.

Accordingly, there exists a need for improved methods of detecting and repairing flash cells that are leaky.

SUMMARY OF THE INVENTION

The above mentioned and other deficiencies are addressed in the following detailed description. According to one embodiment of the present invention a method includes operating a flash memory device to store data in a number of flash cells and initiating an operation to detect or repair leaky flash cells in the flash memory device by coupling one or more selected signals to the flash memory device from a source external to the flash memory device. According to another embodiment of the present invention a system includes a flash memory device having a number of flash cells and a number of pins coupled to exchange interface signals, address signals, and data signals. The system also includes a controller coupled to the pins of the flash memory device to exchange the interface signals, address signals, and data signals with the flash memory device. The controller includes instructions to store data in the flash cells and initiate an operation to detect or repair leaky flash cells in the flash memory device by coupling one or more selected signals to the pins of the flash memory device.

Advantages of the present invention will be apparent to one skilled in the art upon an examination of the detailed description.

DETAILED DESCRIPTION

In the following detailed description of exemplary embodiments of the present invention, reference is made to the accompanying drawings which form a part hereof, and in which are shown by way of illustration specific exemplary embodiments in which the present invention may be practiced. These embodiments are described in sufficient detail to enable those skilled in the art to practice the present invention, and it is to be understood that other embodiments may be utilized and that logical, mechanical, electrical and other changes may be made without departing from the spirit or scope of the present invention. The following detailed description is, therefore, not to be taken in a limiting sense, and the scope of the present invention is defined only by the claims.

In this description a flash cell is described as being activated or switched on when it is rendered conductive by a control gate voltage that exceeds its threshold voltage, and the flash cell is described as being in an inactive state or switched off when the control gate voltage is below the threshold voltage and the flash cell is non-conductive. A digital signal of 1 may also be called a high signal and a digital signal of 0 may also be called a low signal.

Figure 1:
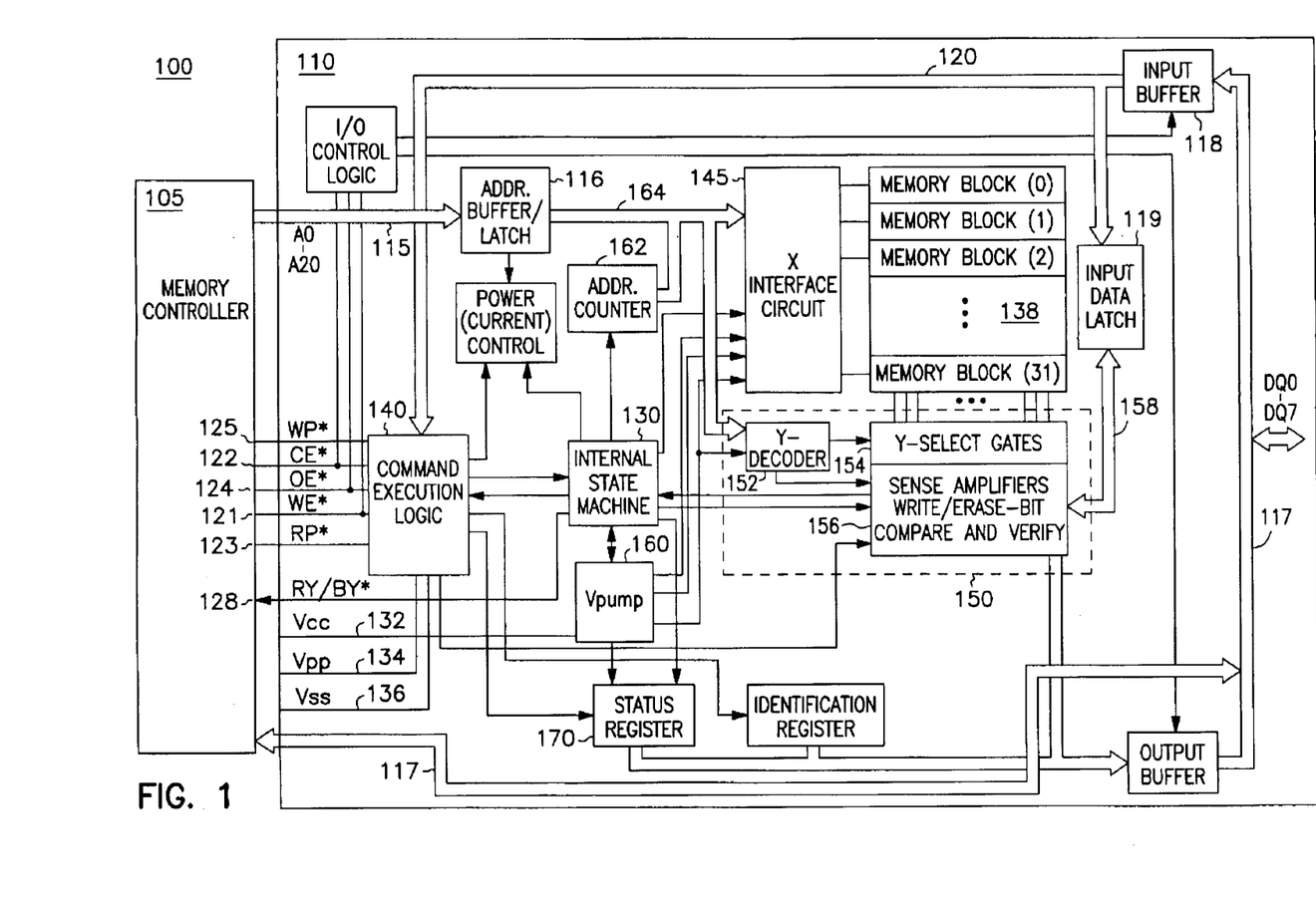
FIG. 1 is a schematic diagram of a flash memory system according to an embodiment of the present invention.

FIG. 1 is a schematic diagram illustrating a flash memory system 100 according to an embodiment of the present invention. The memory system 100 includes a memory controller 105 and a flash memory integrated circuit (IC) 110. The controller 105 includes a control device such as a microprocessor to provide interface signals to the IC 110. The interface signals include address signals provided over multiple address lines 115 to an address buffer and latch 116, and data signals communicated over multiple data lines 117. The data lines 117 are coupled to an input buffer 118 which stores the data signals for transfer to an input data latch 119 over multiple internal data lines 120. Other interface signals provided by the controller 105 include a write enable signal WE* at node 121, a chip enable signal CE* at node 122, a reset/power-down signal RP* at node 123, an output enable signal OE* at node 124, and a write protect signal WP* at node 125, all of which are active low signals. The IC 110 provides a status signal RY/BY* to the controller 105 at node 128 to indicate the status of an internal state machine 130. The IC 110 also receives a positive power supply voltage $V_{CC}$ at node 132, a write/erase supply or programming voltage $V_{PP}$ at node 134, and a reference voltage such as a substrate ground voltage $V_{SS}$ at node 136 which is approximately 0 Volts. Each of the address lines 115, data lines 117, and nodes 121–128 is terminated at a pin in the IC 110 that may be coupled to the controller 105 by a line.

The IC 110 includes an array 138 of floating gate transistor memory cells or flash cells arranged in 32 flash cell blocks. Each block in the array 138 contains 64 kilobytes of flash cells. Flash cells in each block are erased as a group at the same time. A command execution logic module 140 receives the above-described interface signals from the controller 105. The module 140 controls the state machine 130 which controls individual acts necessary for programming, reading, and erasing the flash cells in the array 138. More specifically the state machine 130 controls detailed operations of the IC 110 such as providing write and block erase timing sequences to the array 138 through an X-interface circuit 145 and a Y-interface circuit 150.

The Y-interface circuit 150 provides access to individual flash cells through data lines in the array 138. Data lines in the Y-interface circuit 150 are connected to a bit line driver circuit (not shown). The Y-interface circuit 150 includes a Y-decoder circuit 152, Y-select gates 154, and sense amplifiers and write/erase bit compare and verify circuits 156. The X-interface circuit 145 provides access to rows of flash cells through word lines in the array 138, which are electrically coupled to the control gates of the flash cells in the array 138. The X-interface circuit 145 includes decoding and control circuits for erasing the blocks of flash cells in the array 138. The write/erase bit compare and verify circuits 156 are coupled to exchange data with the input data latch 119 over a set of internal data lines 158.

The IC 110 includes a charge pump circuit 160 to generate an elevated voltage Vpump for programming, erasing, or reading the flash cells in the array 138. The pump circuit 160 is coupled to receive the positive power supply voltage $V_{CC}$ from the node 132 and provides the voltage Vpump to the X-interface circuit 145, the Y-decoder circuit 152, and the state machine 130 over a plurality of lines. In an alternate embodiment of the present invention, the pump circuit 160 may provide a different elevated voltage over each of the lines shown in FIG. 1. The state machine 130 controls an address counter 162 which is capable of providing a sequence of addresses on an internal set of address lines 164 coupled between the address buffer and latch 116, the X-interface circuit 145, and the Y-decoder circuit 152.

The IC 110 also includes a status register 170 coupled to receive signals from the state machine 130, the module 140, and the pump circuit 160. Bits in the status register 170 indicate the status of the IC 110, and the status register 170 is read by the controller 105.

Figure 2:
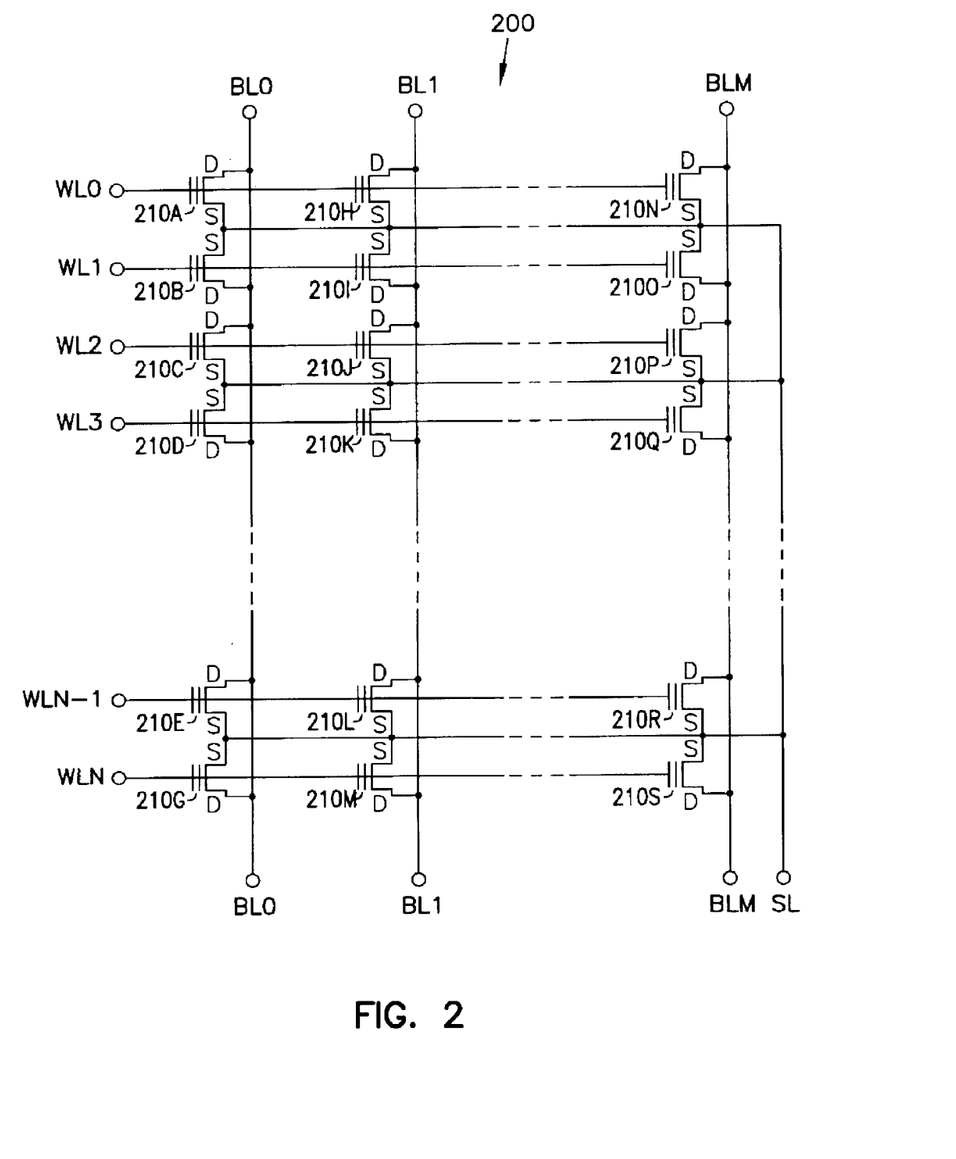
FIG. 2 is a schematic diagram of a block of flash cells in the memory system of FIG. 1.

FIG. 2 is an electrical schematic diagram of a block 200 of flash cells 210A–210S in the array 138 according to embodiments of the present invention. Some flash cells in the block 200 are omitted from FIG. 2 for purposes of clarity. The flash cells 210 are arranged in rows and columns. All of the flash cells 210 in a particular column have drains D connected to a common bit line BL and all of the flash cells 210 in a particular row have control gates connected to a common word line WL. The bit lines BL are identified as BL0–BLM and the word lines WL are identified as WL0–WLN. All of the flash cells 210 in the block 200 have sources S connected to a common source line SL. The remaining flash cells in the array 138 are arranged into separate blocks having separate source lines. The flash cells in different blocks are erased independently to reduce the required erase current.

The flash cells 210 are arranged in column pairs, with each flash cell 210 of the pair sharing a common source S. For example, a flash cell pair 210J and 210K have a common source S connected to the source line SL. The drains D of the flash cells 210 are connected to the bit line BL associated with the column in which the flash cells 210 are located. For example, the flash cell pair 210J and 210K have their drains D connected to a common bit line BL1.

A selected one of the flash cells 210A–210S in the block 200 is programmed by holding the source line SL to ground or zero volts, coupling approximately 5–7 volts to the bit line BL connected to the flash cell, and applying a high positive voltage programming pulse of approximately 10 volts to the word line WL of the flash cell. In this description when a programming pulse is described as being applied to a flash cell one skilled in the art will understand that the flash cell is being programmed according to the above-described method.

A selected one of the flash cells 210A–210S in the block 200 is read by holding the source line SL to ground, coupling approximately 1 volt to the bit line BL connected to the flash cell, applying approximately 5.4 volts to the word line WL of the flash cell, and sensing current in the flash cell through the bit line BL. The current is sensed by one of the sense amplifiers 156 that is coupled to the bit line BL. The sensed current is inversely related to the threshold voltage of the flash cell. The higher the threshold voltage, the less current is sensed in the flash cell, and visa versa.

The flash cells 210A–210S in the block 200 are erased by holding the word lines WL0–WLN to ground, allowing the bit lines BL0–BLM to float, and applying a high positive voltage erase pulse of approximately 12 volts to the sources S through the source line SL. Charge is removed from the floating gate of the flash cell when it is erased.

The term pulse is used in a broad sense in this description, referring to the application of a selected voltage level to a terminal for a finite time period. Those skilled in the art having the benefit of this description will understand that a single pulse such as an erase pulse may be applied continuously for the finite time period, or may include a series of shorter discrete pulses applied in sequence and having a summed or total time period equal to the finite time period.

In the embodiments of the present invention described herein a flash cell is deemed to be erased if it has a threshold voltage of less than approximately 3 volts. A flash cell is deemed to be programmed if it has a threshold voltage of greater than approximately 5 volts. A flash cell is read by applying 5.4 volts to its control gate to ensure that it is switched on. The amount of current in the channel region of the flash cell indicates its threshold voltage. A flash cell that is leaking charge from its floating gate, or has suffered unwanted charge loss or leakage, is a leaky flash cell. The leaky flash cell is repaired by a programming pulse, also called a repair pulse, which adds charge to the floating gate. A repaired flash cell has the threshold voltage of a programmed flash cell. Only a programmed flash cell can be identified as being leaky. An erased flash cell will not be identified as being leaky because its threshold voltage will remain less than approximately 3 volts even if it is losing charge from its floating gate, and the data it is storing will not change.

According to embodiments of the present invention, an operation to detect and repair leaky flash cells is initiated or triggered by a signal or set of signals coupled to a flash memory integrated circuit from an external source such as a controller. The embodiments of the present invention give a user or designer of a memory system flexibility in choosing when to carry out the operation to detect and repair leaky flash cells. Methods and circuitry for carrying out the operation to detect and repair leaky flash cells will now be described followed by methods for triggering the operation.

Figure 3:
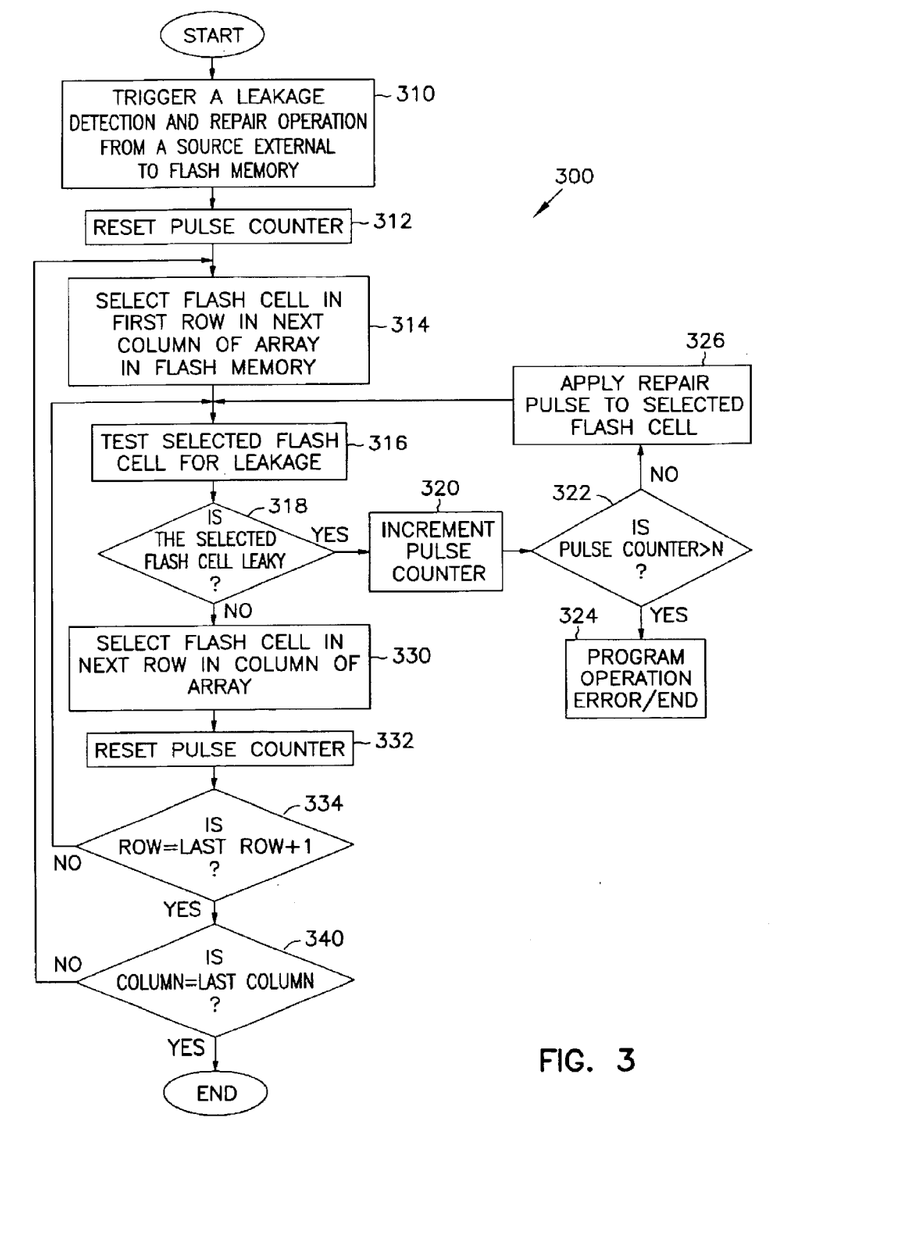
FIG. 3 is a flow chart of a method for testing flash cells for leakage and repairing leaky flash cells according to an embodiment of the present invention.

A method 300 for testing flash cells for leakage and repairing leaky flash cells the array 138 is shown in FIG. 3. In the method 300 each of the flash cells in the array 138 is checked for leakage, and repair pulses are applied to the leaky flash cells. A leakage detection and repair operation is triggered in 310 from a source external to the IC 100. A pulse counter is then reset in 312. A flash cell in a first row of a first column in the array 138 is selected in 314, and the selected flash cell is tested for leakage in 316 in a manner that will be more fully described below. The method 300 determines whether the selected flash cell is leaky in 318, and if it is leaky the pulse counter is incremented in 320. The pulse counter is checked in 322, and if the pulse counter is greater than a selected limit N, indicating that too many repair pulses have been applied to the selected flash cell, the method 300 ends with an error in 324. The error in 324 indicates that the selected flash cell has failed. If the pulse counter is less than or equal to N a repair pulse is applied to the selected flash cell in 326 and the acts 316–326 are repeated until the threshold voltage of the selected flash cell is raised sufficiently or until the error in 324 occurs. The repair pulse is applied to the leaky flash cell to prevent a loss of data. If in 318 it is determined that the selected flash cell is not leaky, a new flash cell in the next row of the column is selected in 330 and the pulse counter is reset in 332. The method 300 determines in 334 whether the row of the newly selected flash cell is beyond the last row in the column. If the newly selected flash cell is in a row of the column then the acts 316–326 are carried out for the newly selected flash cell. If it is determined in 334 that the row of the newly selected flash cell is beyond the last row in the column then the method 300 determines in 340 if the column is the last column in the array 138. If so, then the method 300 ends. If there are additional columns in the array 138, a flash cell in a first row in a next column in the array 138 is selected in 314, and the acts 316-326 are carried out for the newly selected flash cell. The method 300 thereby tests all of the flash cells in the array 138 and repairs those flash cells found to be leaky.

Figure 4:
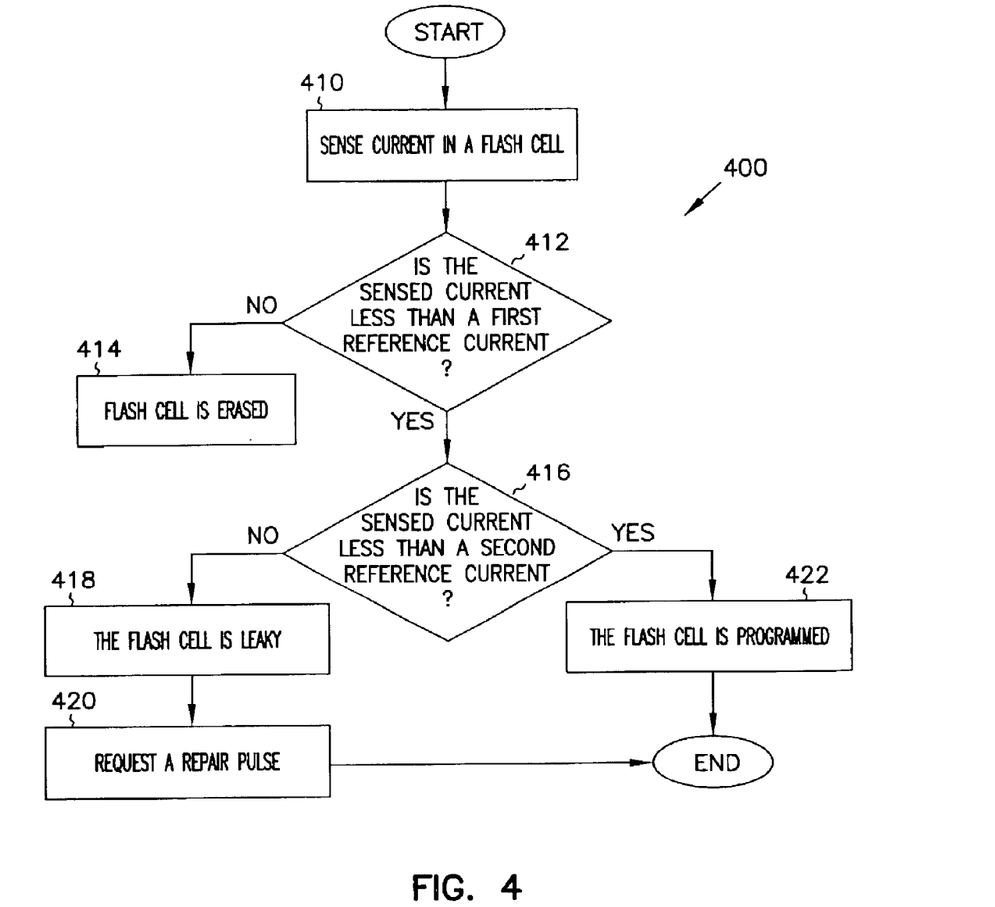
FIG. 4 is a flow chart of a method for testing a flash cell for leakage according to an embodiment of the present invention.

A method 400 for testing a flash cell for leakage is shown in FIG. 4 according to an embodiment of the present invention. The method 400 may be used in 316 of the method 300 to test a flash cell for leakage. A flash cell is read in 410 by applying approximately 5.4 volts to its control gate and sensing a current in the flash cell. In 412 the sensed current is compared with a first reference current that would be in the flash cell if its threshold voltage were approximately 4 volts. If the sensed current is greater than the first reference current then the flash cell is identified as erased in 414, having a threshold voltage of less than 4 volts. If the sensed current is less than the first reference current then the flash cell has been programmed, having a threshold voltage of greater than 4 volts. The sensed current is then compared with a second reference current in 416 that would be in the flash cell if its threshold voltage were 4.5 volts. The threshold voltage is chosen to be 4.5 volts to indicate whether the floating gate has lost some charge while maintaining its programmed state. If the sensed current is greater than the second reference current, then the flash cell is identified as being leaky in 418 because its threshold voltage has fallen below 4.5 volts due to an unwanted loss of charge from the floating gate. A repair pulse is requested for the flash cell in 420 to restore its threshold voltage. The request for a repair pulse in 420 may be made by setting a bit in the status register 170. If the sensed current is less than the second reference current then the flash cell is identified as being programmed and not leaky in 422. Of course, those skilled in the art having the benefit of this description will recognize that other combinations of threshold voltages may be used as reference points for identifying leaky flash cells.

Figure 5:
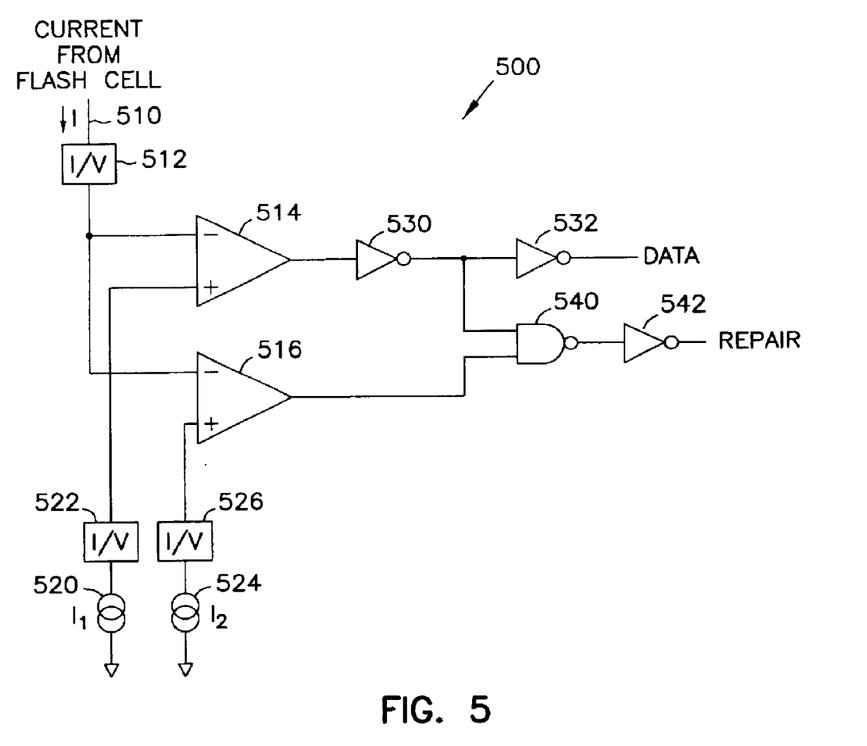
FIG. 5 is an electrical schematic diagram of a circuit for testing a flash cell for leakage according to an embodiment of the present invention.

A circuit 500 for reading flash cells and for testing flash cells for leakage according to an embodiment of the present invention is shown in FIG. 5. The circuit 500 may be used in 316 of the method 300 to test a flash cell for leakage. The circuit 500 is located in the IC 110, and may be in the sense amplifiers 156 shown in FIG. 1. Current I from a flash cell being read is received on a line 510 and is converted to a voltage signal, also called a read signal, by a current to voltage conversion circuit 512. The current to voltage conversion circuit 512 generates a low read signal if the current I is high, and a high read signal if the current I is low. The read signal is coupled to inverting inputs of a first sense amplifier 514 and a second sense amplifier 516. In this embodiment of the present invention the first and second sense amplifiers 514, 516 are comparators. A first reference current $I_1$ is generated in a first current source 520 to be approximately equal to current in the flash cell if it had a threshold voltage of 4.0 volts. In one embodiment of the present invention, $I_1$ is 30 microamps. $I_1$ is converted into a first reference signal by a second current to voltage conversion circuit 522 that is coupled to a non-inverting input of the first sense amplifier 514. A second reference current $I_2$ is generated in a second current source 524 to be approximately equal to current in the flash cell if it had a threshold voltage of 4.5 volts. In one embodiment of the present invention, $I_2$ is 20 microamps. $I_2$ is converted into a second reference signal by a third current to voltage conversion circuit 526 that is coupled to a non-inverting input of the second sense amplifier 516.

The read signal is compared with the first reference signal in the first sense amplifier 514 to generate a data signal at an output of the first sense amplifier 514. The data signal is inverted by a first inverter 530, and inverted again by a second inverter 532 to output a data signal to the IC 110 indicating whether the flash cell is programmed or erased. The read signal is compared with the second reference signal in the second sense amplifier 516 to determine whether the flash cell is leaky. An output of the second sense amplifier 516 is coupled to one input of a NAND gate 540, and a second input of the NAND gate 540 is connected to an output of the first inverter 530 such that the NAND gate 540 generates a signal at its output that is inverted by a third inverter 542 into a repair signal indicating whether the flash cell is leaky and needs a repair pulse. The operation of the circuit 500 may be further described with reference to Table 1:

TABLE 1

| flash cell current I (microamps) | flash cell condition | data signal | repair signal |
|---|---|---|---|
| $I > I_1$ | erased | 1 | 0 |
| $I_2 < I < I_1$ | low programmed | 0 | 1 |
| $I < I_2$ | programmed | 0 | 0 |

As shown in Table 1, the circuit 500 operates in the following manner. If I is greater than $I_1$, the threshold voltage of the flash cell is less than 4 volts, it is erased, and the data signal is high. The low inverted data signal is applied to the second input of the NAND gate 540 to ensure that the repair signal is low and the flash cell does not receive a repair pulse. When I is less than $I_2$, the threshold voltage of the flash cell is greater than 4.5 volts, it is programmed, and the data signal is low. The output of the second sense amplifier 516 is also low such that the repair signal is low and the flash cell does not receive a repair pulse. If I is between $I_1$ and $I_2$, the threshold voltage of the flash cell is between 4 and 4.5 volts and is therefore leaky. In other words, the flash cell has been programmed but has lost charge and its threshold voltage has dropped slightly. The data signal is low but the output of the second sense amplifier is high, so the NAND gate 540 receives two high inputs and generates a high repair signal from the third inverter 542. When the repair signal is high a repair pulse is applied to the flash cell to restore charge to the floating gate and preserve the data stored in the flash cell.

One skilled in the art having the benefit of this description will recognize that the reference currents $I_1$ and $I_2$ will be selected depending on the particular characteristics of the flash cells and the desired reference points around which the flash cells are to be read and tested for leakage.

The methods 300 and 400 may be implemented as a series of programmable instructions stored and implemented in the controller 105. The first and second reference signals may be generated by a programmable voltage generator such as the pump circuit 160 in the IC 110. The methods 300 and 400 may also be implemented in the state machine 130. The state machine 130 is a sequential logic circuit including both logic gates and storage elements designed to implement algorithms directly in hardware. The state machine 130 may include logic gates and storage elements to carry out each act of the methods 300 and 400 except the trigger of 310, which occurs external to the IC 110. Other portions of the IC 110 may also be used to implement the methods 300 and 400. For example, the pump circuit 160 may be used to provide the first and second reference signals and any voltages needed to read the flash cell. The flash cell may be read by a sense amplifier in the sense amplifiers 156, and the read data may be stored in the input data latch 119. The flash cells may also be tested for leakage by the circuit 500 shown in FIG. 5 and located in the IC 110. The methods 300 and 400 may be implemented in other ways known to those skilled in the art having the benefit of this description.

According to embodiments of the present invention, an operation to detect and repair leaky flash cells implemented according to the method 300 is initiated or triggered by a signal or set of signals coupled to the IC 110 from an external source such as the controller 105. As mentioned above, the controller 105 may be a microprocessor. The operation is triggered in 310 of the method 300 shown in FIG. 3.

According to one embodiment of the invention, the controller 105 includes instructions stored and implemented to trigger the method 300 by applying a supervoltage of, for example, 12 volts, to one of the nodes 121–125 or one of the address lines 115 of the IC 110 shown in FIG. 1. The supervoltage is higher than other voltages supplied to the IC 110 such as the power supply voltage $V_{CC}$, the programming voltage $V_{PP}$, and the reference voltage $V_{SS}$, which may be detected as a trigger for the method 300.

According to another embodiment of the present invention, a selected set of interface signals may be asserted at one time by the controller 105 to trigger the method 300. For example, the write enable signal WE* at node 121, the chip enable signal CE* at node 122, and the output enable signal OE* at node 124, shown in FIG. 1, may all be asserted low at the same time as a trigger for the method 300.

According to another embodiment of the present invention, the controller 105 includes instructions stored and implemented to trigger the method 300 at regular intervals according to a clock. For example, the method 300 may be triggered once every 24 hours. The method 300 may be triggered at regular intervals by asserting one or more interface signals or according to any of the other embodiments of the invention described herein.

According to another embodiment of the present invention, the method 300 may be triggered coincident with another operation that the IC 110 is instructed to perform. For example, the IC 110 goes into a power-down mode after the reset/power-down signal RP* at node 123 is asserted low. In the power-down mode no write or read takes place and the IC 110 absorbs an insubstantial amount of power. The method 300 may be triggered when the reset/power-down signal RP* is asserted low prior to the power-down mode. In alternative embodiments of the present invention the method 300 may be triggered when one of the other interface signals is asserted.

According to another embodiment of the present invention, the controller 105 includes instructions stored and implemented to trigger the method 300 by applying a sequence of voltages to a single node of the IC 110. For example, a specific sequence of high and low voltages may be coupled to the node 124 that are recognized by the module 140 to trigger the method 300.

According to another embodiment of the present invention, the controller 105 includes instructions stored and implemented to trigger the method 300 by issuing a command to the IC 110 over the data lines 117. Commands and their uses are defined in the Micron Memory Data Book 1999 for flash memory devices. The commands are organized into a command set, and each command is represented by an 8-bit hexadecimal value that is coupled as a set of signals to the IC 110. Each command is coupled from the controller 105 to the data lines 117, the input buffer 118, and the internal data lines 120 to be received by the module 140 which carries out the command. Each command is latched on a rising edge of the write enable signal WE* coupled to node 121, or on a rising edge of the chip enable signal CE* coupled to node 122. A new command, such as 30H, may be defined to trigger the method 300 and added to the command set. Other hexadecimal values that are not already defined in the command set may also be used to trigger the method 300.

Figure 6:
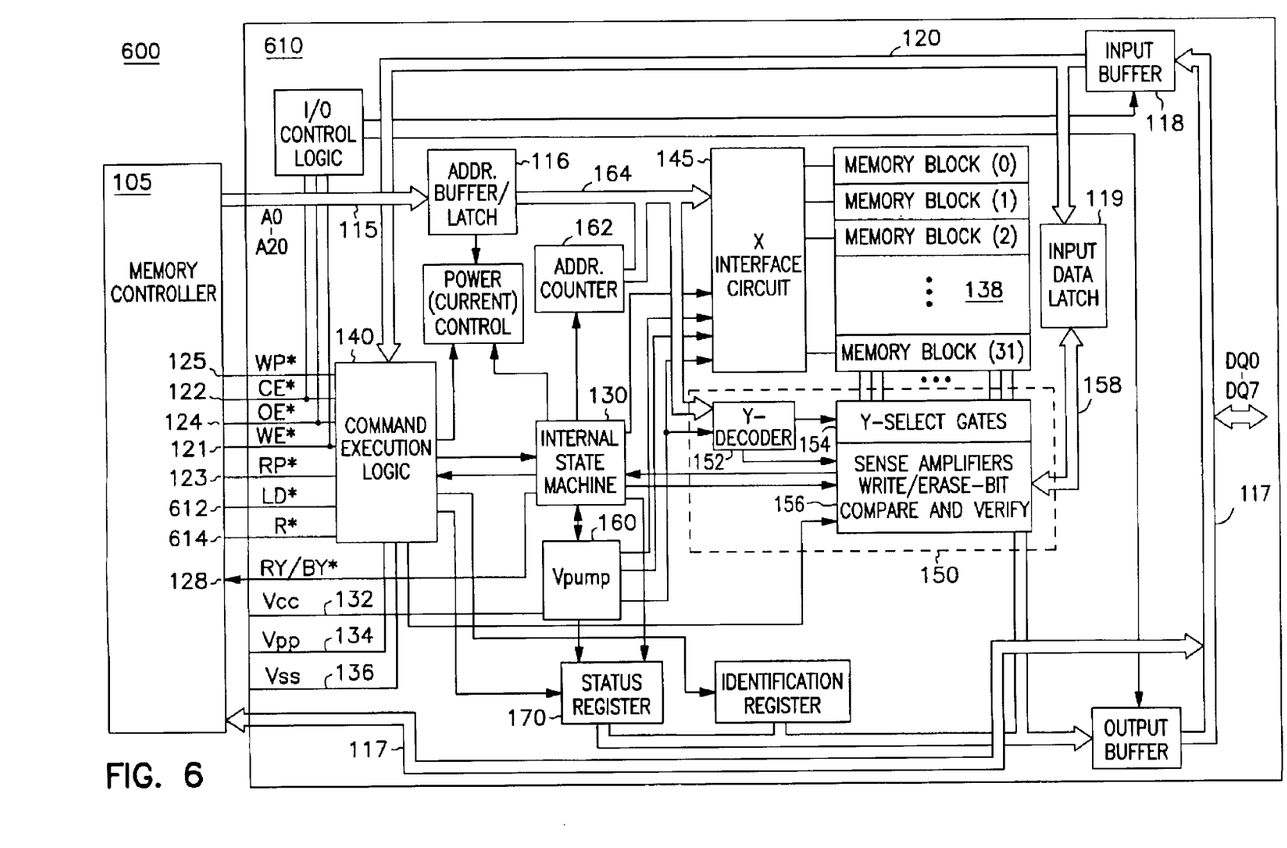
FIG. 6 is a schematic diagram of a flash memory system according to an embodiment of the present invention.

FIG. 6 is a schematic diagram illustrating a flash memory system 600 according to another embodiment of the present invention. The memory system 600 is similar to the memory system 100 shown in FIG. 1, and similar elements have retained the same reference numerals and will not be described for purposes of brevity. The memory system 600 includes a flash memory integrated circuit (IC) 610 with two additional nodes 612, 614, for receiving a leakage detection signal LD* and a repair signal R*, respectively. The nodes 612, 614 are terminated at pins in the IC 610 to be coupled to the controller 105. The leakage detection signal LD* is asserted to trigger a leakage detection operation in which leaky flash cells are detected but not repaired. Such an operation may include all of the acts in the method 300, shown in FIG. 3, except the acts 320–326 in which a repair pulse is applied to each leaky flash cell. If a leaky flash cell is detected a bit may be set in the status register 170 to indicate that the leaky flash cell needs to be repaired. The use of the status register 170 is described above with reference to the act 420 in FIG. 4. The repair may be carried out by reprogramming data into the leaky flash cell. In an alternative embodiment of the present invention, the repair signal R* is asserted to trigger a repair operation in which the leaky flash cells are detected and repaired according to the method 300.

Figure 7:
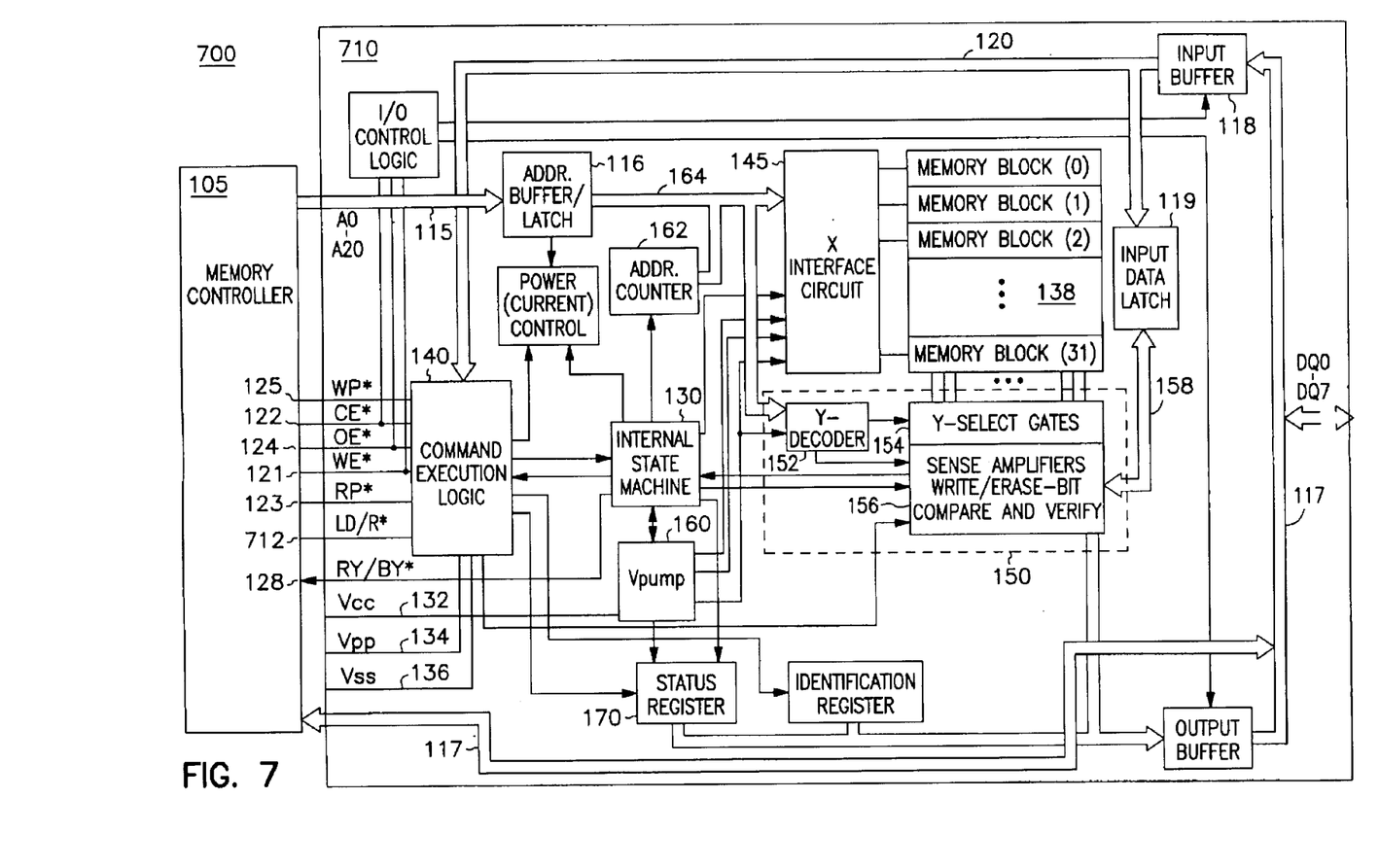
FIG. 7 is a schematic diagram of a flash memory system according to an embodiment of the present invention.

FIG. 7 is a schematic diagram illustrating a flash memory system 700 according to another embodiment of the present invention. The memory system 700 is similar to the memory system 100 shown in FIG. 1, and similar elements have retained the same reference numerals and will not be described for purposes of brevity. The memory system 700 includes a flash memory integrated circuit (IC) 710 with an additional node 712 for receiving a leakage detection and repair signal LD/R*. The node 712 is terminated at a pin in the IC 710 to be coupled to the controller 105. The leakage detection and repair signal LD/R* is asserted to trigger a leakage detection and repair operation in which leaky flash cells are detected and repaired according to the method 300.

Each of the embodiments of the present invention described above may be used to trigger a leakage detection operation, a repair operation, or a leakage detection and repair operation in the IC 110.

Figure 8:
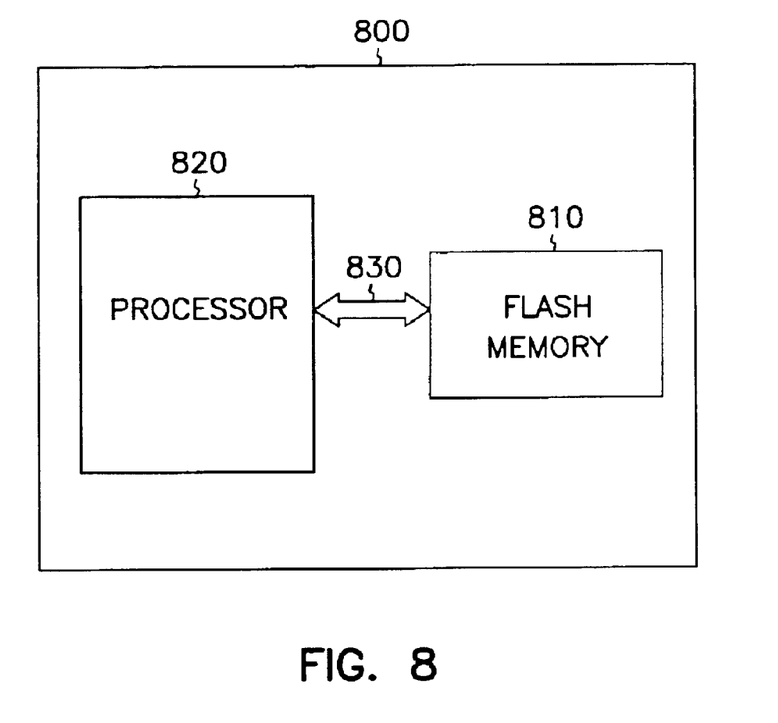
FIG. 8 is a block diagram of an integrated circuit chip according to an embodiment of the present invention.

An integrated circuit chip 800 according to an embodiment of the present invention is shown in FIG. 8. The chip 800 includes an embedded flash memory 810 such as the flash memory integrated circuits 110, 610, 710, and may include the circuit 500, and may implement the methods 300 and 400 according to the embodiments of the present invention described above. The embedded flash memory 810 shares the chip 800 with another integrated circuit 820 such as a processor, or possibly several other integrated circuits. The chip 800 including the embedded flash memory 810 and the processor 820 may comprise one of the memory systems 100, 600, or 700. The embedded flash memory 810 and the integrated circuit 820 are coupled together by a suitable communication line or bus 830.

Figure 9:
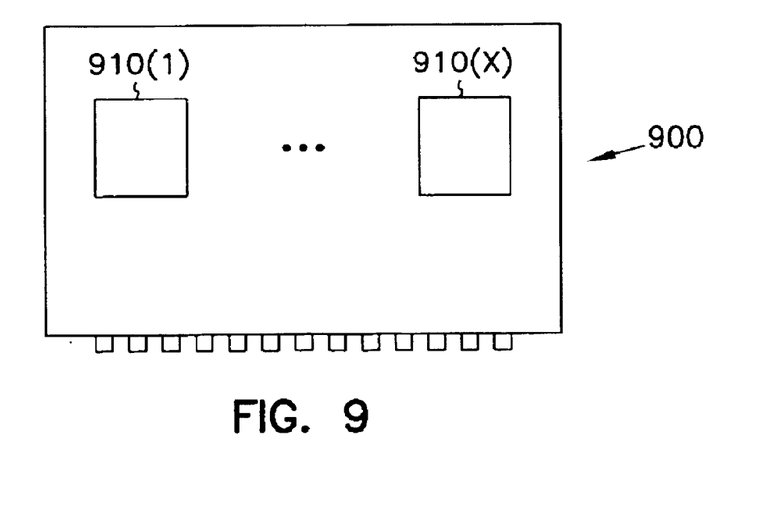
FIG. 9 is block diagram of a compact flash memory card according to an embodiment of the present invention.

One skilled in the art having the benefit of this description will understand that more than one flash memory integrated circuit 110, 61, 710 according to the embodiments of the invention described above may be included in various package configurations. For example, a compact flash memory card 900 according to an embodiment of the present invention is shown in FIG. 9. The card 900 includes a plurality of flash memory integrated circuits 910(1)–910(X) each of which are similar to the flash memory integrated circuits 110, 610, 710 shown in FIGS. 1, 6, and 7, respectively. The card 900 may be a single integrated circuit in which the flash memory integrated circuits 910(1)–910(X) are embedded.

Figure 10:
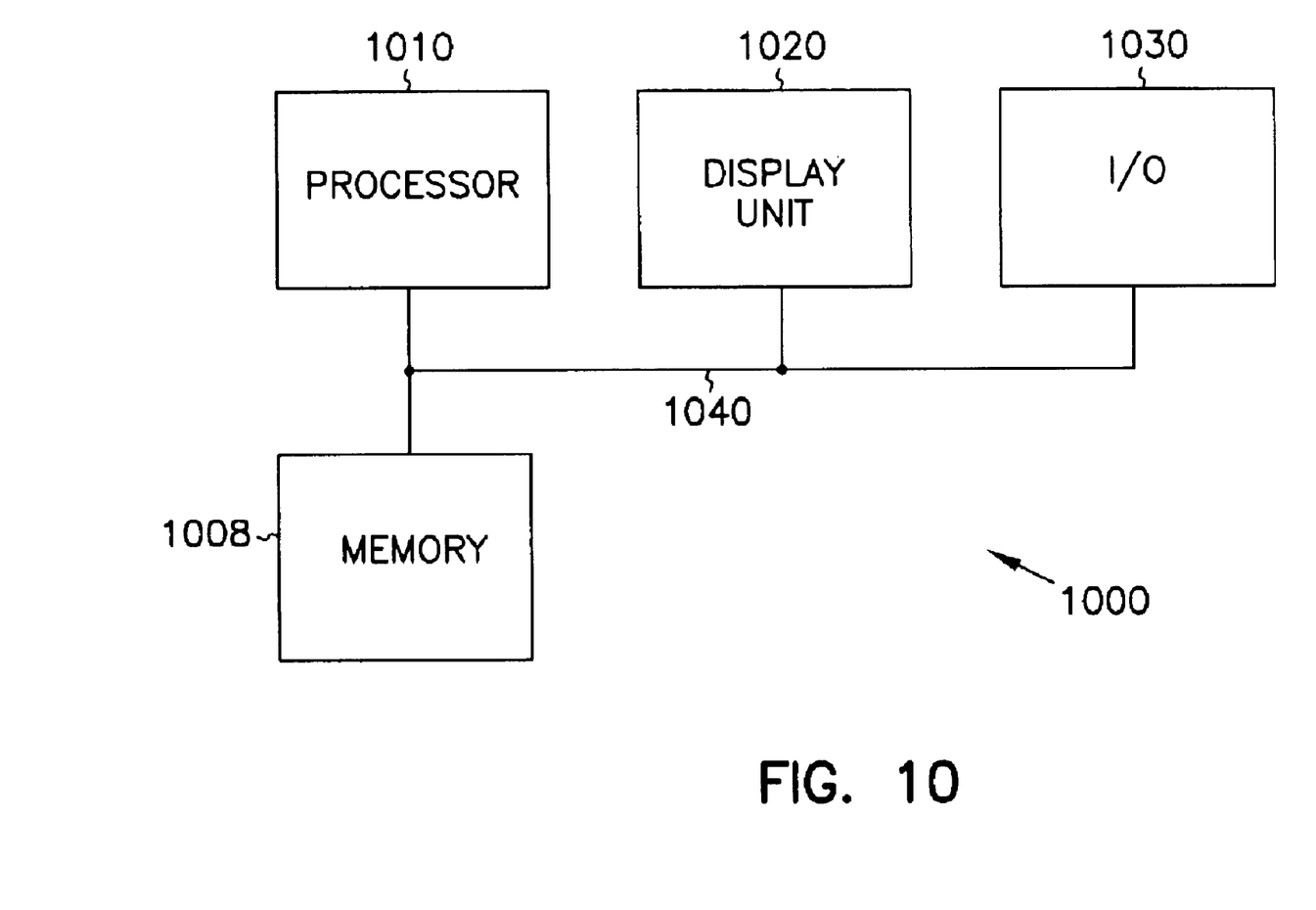
FIG. 10 is a block diagram of an information-handling system according to an embodiment of the present invention.

FIG. 10 is a block diagram of an information-handling system 1000 according to an embodiment of the present invention. The information-handling system 1000 includes a memory system 1008, a processor 1010, a display unit 1020, and an input/output (I/O) subsystem 1030. The processor 1010 may be, for example, a microprocessor. The memory system 1008 is comprised of one of the flash memory integrated circuits 110, 610, 710, and may include the circuit 500, and may implement the methods 300 and 400 according to the embodiments of the present invention described above. The processor 1010 and the memory system 1008 may be embedded on a single integrated circuit chip such as the chip 800 shown in FIG. 8. The processor 1010, the display unit 1020, the I/O subsystem 1030, and the memory system 1008 are coupled together by a suitable communication line or bus 1040.

According to another embodiment of the present invention, a user may input instructions to the processor 1010 or the memory system 1008 through the I/O subsystem 1030 to trigger the method 300. The I/O subsystem 1030 may be a keyboard or other device to allow the user to communicate with the system 1000.

In various embodiments of the present invention, the information-handling system 1000 is a computer system (such as, for example, a video game, a hand-held calculator, a television set-top box, a fixed-screen telephone, a smart mobile phone, a personal digital assistant (PDA), a network computer (NC), a hand-held computer, a personal computer, or a multiprocessor supercomputer), an information appliance (such as, for example, a cellular telephone, a pager, or a daily planner or organizer), an information component (such as, for example, a magnetic disk drive or telecommunications modem), or other appliance (such as, for example, a hearing aid, washing machine or microwave oven having an electronic controller).

In the embodiments of the present invention described above an operation to detect and repair leaky flash cells is initiated or triggered by a signal or set of signals coupled to a flash memory integrated circuit from an external source such as a controller. The embodiments of the present invention give a user or designer of a memory system flexibility in choosing when to carry out the operation to detect and repair leaky flash cells.

Although specific embodiments have been illustrated and described herein, it will be appreciated by those skilled in the art having the benefit of this description that any equivalent arrangement may be substituted for the specific embodiments shown. The present invention is therefore limited only by the claims and equivalents thereof.

What is claimed is:

1. A method comprising:
   operating a flash memory device to store data in a plurality of flash cells; and
   initiating an operation to detect or repair leaky programmed flash cells in the flash memory device by coupling one or more selected signals to the flash memory device from a source external to the flash memory device.

2. The method of claim 1 wherein initiating an operation comprises initiating an operation to detect or repair leaky programmed flash cell in the flash memory device by coupling a supervoltage to a selected pin or address line in the flash memory device.

3. The method of claim 1 wherein initiating an operation comprises initiating an operation to detect or repair leaky programmed flash cells in the flash memory device by asserting a selected plurality of interface signals coupled to the flash memory device.

4. The method of claim 3 wherein initiating an operation comprises initiating an operation to detect or repair leaky programmed flash cells in the flash memory device by asserting a write enable signal, a chip enable signal, and an output enable signal coupled to the flash memory device.

5. The method of claim 1 wherein initiating an operation comprises initiating an operation to detect or repair leaky programmed flash cells in the flash memory device at regular intervals according to a clock.

6. The method of claim 5 wherein initiating an operation comprises initiating an operation to detect or repair leaky programmed flash cells in the flash memory device every 24 hours according to the clock.

7. The method of claim 1 wherein initiating an operation comprises initiating an operation to detect or repair leaky programmed flash cells in the flash memory device by asserting an interface signal coupled to the flash memory device.

8. The method of claim 7 wherein initiating an operation comprises initiating an operation to detect or repair leaky programmed flash cells in the flash memory device by asserting a reset/power-down signal coupled to the flash memory device.

9. The method of claim 1 wherein initiating an operation comprises initiating an operation to detect or repair leaky programmed flash cells in the flash memory device by applying a selected sequence of voltages to a pin in the flash memory device.

10. The method of claim 1 wherein initiating an operation comprises initiating an operation to detect or repair leaky programmed flash cells in the flash memory device by coupling a command to data lines in the flash memory device.

11. The method of claim 10 wherein initiating an operation comprises initiating an operation to detect or repair leaky programmed flash cells in the flash memory device by coupling a command to data lines in the flash memory device and latching the command on a rising edge of a write enable signal coupled to the flash memory device.

12. The method of claim 1 wherein initiating an operation comprises initiating an operation to detect and repair leaky programmed flash cells in the flash memory device by coupling a leakage detection and repair signal to a leakage detection and repair pin in the flash memory device.

13. The method of claim 1 wherein initiating an operation comprises initiating an operation to detect leaky programmed flash cells in the flash memory device by coupling a leakage detection signal to a leakage detection pin in the flash memory device.

14. The method of claim 13 wherein initiating an operation further comprises reprogramming data into at least one leaky programmed flash cell in the flash memory device.

15. The method of claim 13 wherein initiating an operation further comprises initiating an operation to repair leaky programmed flash cells in the flash memory device by coupling a repair signal to a repair pin in the flash memory device.

16. The method of claim 1 wherein initiating an operation comprises initiating an operation to detect or repair leaky programmed flash cells in the flash memory device based on a signal received from an input/output subsystem.

17. The method of claim 1 wherein initiating an operation further comprises:
   for each flash cell in the flash memory device:
      reading the flash cell to generate a read signal;
      comparing the read signal with a first reference signal to indicate data stored in the flash cell;
      comparing the read signal with a second reference signal to indicate if the flash cell is leaky; and
      applying a repair pulse to the flash cell if the flash cell is leaky.

18. A system comprising:
a flash memory device having a plurality of flash cells and a plurality of pins coupled to exchange interface signals, address signals, and data signals; and
a controller coupled to the pins of the flash memory device to exchange the interface signals, address signals, and data signals with the flash memory device, the controller having instructions to:
store data in the flash cells; and
initiate an operation to detect or repair leaky programmed flash cells in the flash memory device by coupling one or more selected signals to the pins of the flash memory device.

19. The system of claim 18 wherein the controller comprises instructions to initiate the operation to detect or repair leaky programmed flash cells in the flash memory device by coupling a supervoltage to a selected pin in the flash memory device.

20. The system of claim 18 wherein the controller comprises instructions to initiate the operation to detect or repair leaky programmed flash cells in the flash memory device by asserting a selected plurality of interface signals coupled to selected pins in the flash memory device.

21. The system of claim 20 wherein in the controller comprises instructions to initiate the operation to detect or repair leaky programmed flash cells in the flash memory device by asserting a write enable signal, a chip enable signal, and an output enable signal coupled to selected pins in the flash memory device.

22. The system of claim 18 wherein the controller comprises instructions to initiate the operation to detect or repair leaky programmed flash cells in the flash memory device at regular intervals according to a clock.

23. The system of claim 22 wherein the controller comprises instructions to initiate the operation to detect or repair leaky programmed flash cells in the flash memory device every 24 hours according to the clock.

24. The system of claim 18 wherein the controller comprises instructions to initiate the operation to detect or repair leaky programmed flash cells in the flash memory device by asserting an interface signal coupled to a selected pin in the flash memory device.

25. The system of claim 24 wherein the controller comprises instructions to initiate the operation to detect or repair leaky programmed flash cells in the flash memory device by asserting a reset/power-down signal coupled to a reset/power-down pin in the flash memory device.

26. The system of claim 18 wherein the controller comprises instructions to initiate the operation to detect or repair leaky programmed flash cells in the flash memory device by applying a selected sequence of voltages to a selected pin in the flash memory device.

27. The system of claim 18 wherein the controller comprises instructions to initiate the operation to detect or repair leaky flash cells in the flash memory device by coupling a command to data pins in the flash memory device.

28. The system of claim 27 wherein the controller comprises instructions to initiate the operation to detect or repair leaky programmed flash cells in the flash memory device by coupling a command to data pins in the flash memory device and latching the command on a rising edge of a write enable signal coupled to a selected pin in the flash memory device.

29. The system of claim 18 wherein the controller comprises instructions to initiate the operation to detect and repair leaky programmed flash cells in the flash memory device by coupling a leakage detection and repair signal to a leakage detection and repair pin in the flash memory device.

30. The system of claim 18 wherein the controller comprises instructions to initiate an operation to detect leaky programmed flash cells in the flash memory device by coupling a leakage detection signal to a leakage detection pin in the flash memory device.

31. The system of claim 30 wherein the controller comprises instructions to reprogram data into at least one leaky programmed flash cell in the flash memory device.

32. The system of claim 30 wherein the controller comprises instructions to initiate an operation to repair leaky programmed flash cells in the flash memory device by coupling a repair signal to a repair pin in the flash memory device.

33. The system of claim 18 wherein the controller comprises instructions to initiate the operation to detect or repair leaky programmed flash cells in the flash memory device based on a signal received from an input/output subsystem.

34. The system of claim 18 wherein the controller and the flash memory device comprise circuits or instructions to:
for each flash cell in the flash memory device:
read the flash cell to generate a read signal;
compare the read signal with a first reference signal to indicate data stored in the flash cell;
compare the read signal with a second reference signal to indicate if the flash cell is leaky; and
apply a repair pulse to the flash cell if the flash cell is leaky.

35. A method comprising:
operating a flash memory device to store data in a plurality of flash cells;
initiating an operation to detect or repair leaky flash cells in the flash memory device by coupling one or more selected signals to the flash memory device from a source external to the flash memory device; and
wherein initiating an operation comprises initiating an operation to detect or repair leaky flash cells in the flash memory device by coupling a supervoltage to a selected pin or address line in the flash memory device.

36. A method comprising:
operating a flash memory device to store data in a plurality of flash cells;
initiating an operation to detect or repair leaky flash cells in the flash memory device by coupling one or more selected signals to the flash memory device from a source external to the flash memory device; and
wherein initiating an operation comprises initiating an operation to detect or repair leaky flash cells in the flash memory device at regular intervals according to a clock.

37. A method comprising:
operating a flash memory device to store data in a plurality of flash cells;
initiating an operation to detect or repair leaky flash cells in the flash memory device by coupling one or more selected signals to the flash memory device from a source external to the flash memory device;
wherein initiating an operation comprises initiating an operation to detect or repair leaky flash cells in the flash memory device by coupling a command to data lines in the flash memory device and latching the command on a rising edge of a write enable signal coupled to the flash memory device.

38. A system comprising:
a flash memory device having a plurality of flash cells and a plurality of pins coupled to exchange interface signals, address signals, and data signals;

a controller coupled to the pins of the flash memory device to exchange the interface signals, address signals, and data signals with the flash memory device, the controller having instructions to:
store data in the flash cells;
initiate an operation to detect or repair leaky flash cells in the flash memory device by coupling one or more selected signals to the pins of the flash memory device; and
wherein the controller comprises instructions to initiate the operation to detect or repair leaky flash cells in the flash memory device by coupling a supervoltage to a selected pin in the flash memory device.

39. A system comprising:
a flash memory device having a plurality of flash cells and a plurality of pins coupled to exchange interface signals, address signals, and data signals;
a controller coupled to the pins of the flash memory device to exchange the interface signals, address signals, and data signals with the flash memory device, the controller having instructions to:
store data in the flash cells;
initiate an operation to detect or repair leaky flash cells in the flash memory device by coupling one or more selected signals to the pins of the flash memory device; and
wherein the controller comprises instructions to initiate the operation to detect or repair leaky flash cells in the flash memory device at regular intervals according to a clock.

40. A system comprising:
a flash memory device having a plurality of flash cells and a plurality of pins coupled to exchange interface signals, address signals, and data signals;
a controller coupled to the pins of the flash memory device to exchange the interface signals, address signals, and data signals with the flash memory device, the controller having instructions to:
store data in the flash cells;
initiate an operation to detect or repair leaky flash cells in the flash memory device by coupling one or more selected signals to the pins of the flash memory device;
wherein the controller comprises instructions to initiate the operation to detect or repair leaky flash cells in the flash memory device by coupling a command to data pills in the flash memory device and latching the command on a rising edge of a write enable signal coupled to a selected pin in the flash memory device.

* * * * *

UNITED STATES PATENT AND TRADEMARK OFFICE
CERTIFICATE OF CORRECTION

PATENT NO. : 6,813,183 B2 Page 1 of 1
APPLICATION NO. : 10/198404
DATED : November 2, 2004
INVENTOR(S) : Chevallier It is certified that error appears in the above-identified patent and that said Letters Patent is hereby corrected as shown below:

In column 11, line 58, in Claim 2, delete "cell" and insert -- cells --, therefor.

In column 13, line 23, in Claim 21, after "wherein" delete "in".

In column 13, line 54, in Claim 27, insert -- programmed -- before "flash cells".

In column 16, line 23, in Claim 40, delete "pills" and insert -- pins --, therefor.

Signed and Sealed this

Twenty-fourth Day of April, 2007

JON W. DUDAS
*Director of the United States Patent and Trademark Office*